(12) United States Patent
Jeong et al.

(10) Patent No.: US 9,985,246 B2
(45) Date of Patent: May 29, 2018

(54) COVER WINDOW FOR DISPLAY DEVICE, DISPLAY DEVICE INCLUDING THE SAME, AND METHOD FOR MANUFACTURING THE SAME

(71) Applicant: SAMSUNG DISPLAY CO., LTD., Yongin-si, Gyeonggi-Do (KR)

(72) Inventors: Yong Cheol Jeong, Yongin-si (KR); Seung Wook Nam, Cheonan-si (KR); Sang Wol Lee, Yongin-si (KR); Ah Young Kim, Gunpo-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 217 days.

(21) Appl. No.: 14/882,481

(22) Filed: Oct. 14, 2015

(65) Prior Publication Data
US 2016/0204377 A1   Jul. 14, 2016

(30) Foreign Application Priority Data
Jan. 9, 2015  (KR) .................... 10-2015-0003660

(51) Int. Cl.
*B32B 3/10* (2006.01)
*B32B 3/16* (2006.01)
*H01L 51/52* (2006.01)
*G02F 1/1333* (2006.01)

(52) U.S. Cl.
CPC .......... *H01L 51/5253* (2013.01); *G02F 2001/133331* (2013.01)

(58) Field of Classification Search
None
See application file for complete search history.

(56) References Cited

U.S. PATENT DOCUMENTS

| | | | |
|---|---|---|---|
| 2011/0054063 A1* | 3/2011 | Ooike | C08L 83/06 522/168 |
| 2011/0210937 A1* | 9/2011 | Kee | G06F 3/041 345/174 |
| 2013/0083496 A1 | 4/2013 | Franklin et al. | |
| 2015/0212300 A1* | 7/2015 | Kubo | G02B 1/041 359/754 |
| 2015/0311260 A1* | 10/2015 | Senda | H01L 51/5253 257/40 |
| 2016/0085268 A1* | 3/2016 | Aurongzeb | G06F 1/1677 345/156 |

FOREIGN PATENT DOCUMENTS

| | | | |
|---|---|---|---|
| KR | 10-2013-0135154 A | 12/2013 | |
| KR | 10-2014-0115178 A | 9/2014 | |
| WO | WO 2014/034507 A1 * | 3/2014 | C08G 59/20 |

* cited by examiner

*Primary Examiner* — David Sample
*Assistant Examiner* — Nicole T Gugliotta
(74) *Attorney, Agent, or Firm* — Lee & Morse, P.C.

(57) ABSTRACT

A cover window for a display device, including a base film; and a coating layer on the base film, the coating layer including a first region and a second region having different hardnesses, the second region having a hardness less than that of the first region, and the base film including the coating layer being slidable from the second region in a direction toward the first region and in a direction from the first region toward the second region.

16 Claims, 6 Drawing Sheets

COVER WINDOW FOR DISPLAY DEVICE, DISPLAY DEVICE INCLUDING THE SAME, AND METHOD FOR MANUFACTURING THE SAME

CROSS-REFERENCE TO RELATED APPLICATION

Korean Patent Application No. 10-2015-0003660, filed on Jan. 9, 2015, in the Korean Intellectual Property Office, and entitled: "Cover Window For Display Device, Display Device Including The Same, and Method For Manufacturing The Same," is incorporated by reference herein in its entirety.

BACKGROUND

1. Field

Embodiments relate to a cover window for a display device, a display device including the same, and a method for manufacturing the cover window for a display device.

2. Description of the Related Art

A liquid crystal display (LCD) or an organic light emitting diode (OLED) may be applied to various mobile electronic devices, such as mobile phones, navigation devices, digital cameras, electronic books, portable game players, or various terminals, as a display device.

SUMMARY

Embodiments may be realized by providing a cover window for a display device, including a base film; and a coating layer on the base film, the coating layer including a first region and a second region having different hardnesses, the second region having a hardness less than that of the first region, and the base film including the coating layer being slidable from the second region in a direction toward the first region and in a direction from the first region toward the second region.

The cover window may further include a third region in which the coating layer is not on the base film. The second region may be between the first region and the third region, and the base film including the coating layer may also be slidable from the second region in a direction toward the third region.

The first region may be less pliable than the second region.

The coating layer may include an initiator; and a compound expressed by the following chemical formula 1

[Chemical Formula 1]

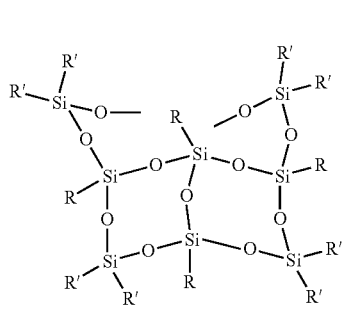

wherein in chemical formula 1, R represents $CH_3$, and R' represents an epoxy group.

The initiator may include one or more of an iodine-based initiator or a borate initiator.

The first region may include the initiator in an amount of 1 to 2 wt %, based on a total amount of the coating layer, and the second region may include the initiator in an amount of 0.1 to 1 wt %, based on a total amount of the coating layer.

Near a boundary between the first region and the second region, an amount of the initiator may gradually decrease from the first region toward the second region.

The coating layer may have a same thickness as the base film.

The cover window may further include a third region where the coating layer is not on the base film. The second region may be between the first region and the third region, and a coating layer having a same hardness as the coating layer in the first region may be included in the third region.

Embodiments may be realized by providing a display device, including a display panel; a cover window on the display panel, the cover window including a base film; and a coating layer on the base film, the coating layer including a first region and a second region having different hardnesses, the second region having a hardness less than that of the first region, and the base film including the coating layer being slidable from the second region in a direction toward the first region and in a direction from the first region toward the second region.

The display device may further include a third region in which the coating layer is not on the base film. The second region may be between the first region and the third region, and the base film including the coating layer may also be slidable from the second region in a direction toward the third region.

The first region may be less pliable than the second region.

The coating layer may include an initiator; and aa compound expressed by the following chemical formula 1,

[Chemical Formula 1]

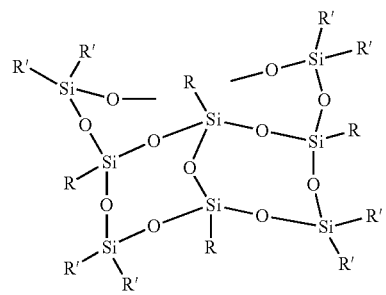

wherein in chemical formula 1, R represents $CH_3$, and R' represents an epoxy group.

The initiator may include one or more of an iodine-based initiator or a borate initiator.

The first region may include the initiator in an amount of 1 to 2 wt %, based on a total amount of the coating layer, and the second region may include the initiator in an amount of 0.1 to 1 wt %, based on a total amount of the coating layer.

Near a boundary between the first region and the second region, an amount of the initiator may gradually decrease from the first region toward the second region.

The coating layer may have a same thickness as the base film.

The display device may further include a third region where the coating layer is not on the base film. The second region may be between the first region and the third region, and a coating layer having a same hardness as the coating layer in the first region may be included in the third region.

The display device may further include a touch panel between the display panel and the cover window.

The display device may further include a passivation layer under the display panel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
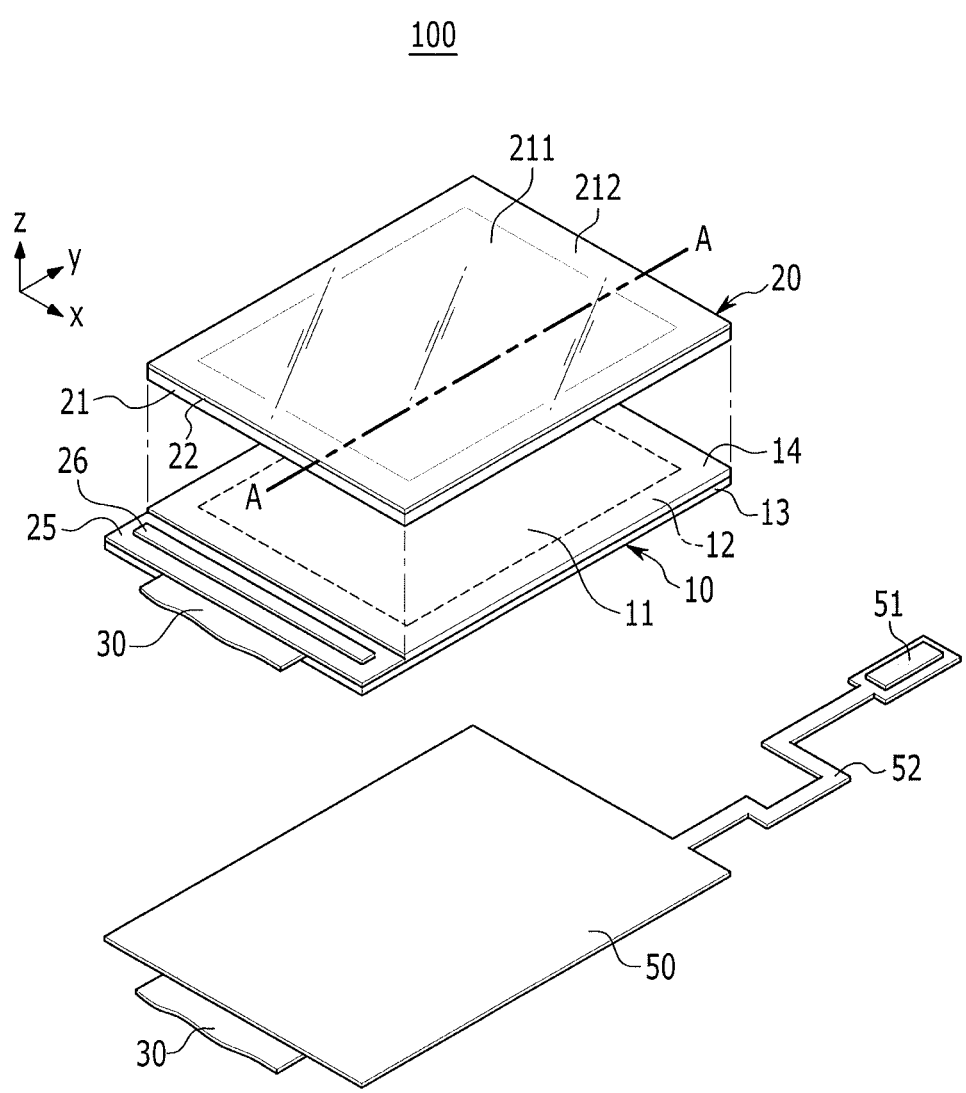
FIG. 1 illustrates an exploded perspective view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Referring to FIG. 1, a display device according to an exemplary embodiment will be described in detail.

FIG. 1 illustrates an exploded perspective view of a display device according to an exemplary embodiment.

Referring to FIG. 1, a display device 100 according to an exemplary embodiment may include a display panel 10 configured to display an image and a cover window 20 disposed in front of the display panel 10 to protect the display panel 10.

The display panel 10 may be an organic light emitting display panel. In an embodiment, the display panel 10 may be another display panel, for example, a liquid crystal display panel, and the display panel 10 may not include a separate upper substrate, and may include a lower substrate including both a field generating electrode and a liquid crystal. In the present exemplary embodiment, an organic light emitting display panel will be exemplified for convenience in explanation.

The display panel 10 may be electrically connected to a printed circuit board (PCB) 50 via a flexible printed circuit 30.

Pixels as basic units for displaying an image may be arranged in a matrix on a first substrate 13 of the display panel 10, and a second substrate 14 may be bonded to the first substrate 13 by a sealing member to help protect the pixels. The first substrate 13 may become a rear substrate, and the second substrate 14 may become a front substrate.

For example, in an active matrix organic light emitting display panel, a pixel may include an organic light emitting element formed of an anode, an organic light emitting layer, and a cathode, and a driving circuit unit for driving the organic light emitting element. The driving circuit unit may be a thin film transistor. A source terminal of the thin film transistor may be connected to a data line, and a gate terminal may be connected to a gate line. A drain terminal may be connected to one electrode, e.g., the anode or the cathode, in the organic light emitting element.

The data line and the gate line may be connected to the printed circuit board (PCB) 50 via the flexible printed circuit 30. An electric signal may be input to the source terminal and the gate terminal of the thin film transistor via the printed circuit board (PCB) 50, the thin film transistor may be turned on or turned off depending on a signal input, and an electric signal required to drive the pixel may be output to the drain terminal.

An integrated circuit chip 26 may be packaged on the first substrate 13 and may control the display panel 10. The integrated circuit chip 26 may generate timing signals for applying a data driving signal and a gate driving signal at an appropriate time. The integrated circuit chip 26 may apply these signals to the data line and the gate line of the display panel 10, respectively. A passivation layer 25 may be formed around the integrated circuit chip 26 to help protect the integrated circuit chip 26.

In the printed circuit board (PCB) 50, electronic elements for processing driving signals may be packaged. The printed circuit board (PCB) 50 may include a connector 51 and an extension unit 52, and the extension unit 52 may be provided at an end of the connector 51 and may transmit an external signal to the printed circuit board (PCB) 50.

In front of the display panel 10, the cover window 20 for protecting the display panel 10 may be positioned. The cover window 20 may help protect the display panel 10 so as not to be broken by external impact. The cover window 20 may be attached to the display panel 10 by a predetermined adhesive layer. In an embodiment, the display panel 10 and the cover window 20 may be spaced from each other with an air layer interposed therebetween.

The cover window 20 may include a base film 21 and a coating layer 22 formed on the base film 21.

The base film 21 may include a transparent unit 211 that is transparent at a region corresponding to a display unit 11 of the display panel 10, and the display unit 11 may be recognized from the outside, and an opaque unit 212 that is opaque at a region corresponding to a non-display unit 12 of the display panel 10 to help prevent the non-display unit 12 from being recognized from the outside. The opaque portion 212 may be configured to cover wirings or components formed on the non-display unit of the display panel 10 so as not to be seen from the outside. The opaque unit 212 may include a logo of a product or an ornamental pattern. In the present specification, the base film 21 may be divided into the transparent unit 211 and the opaque unit 212. In an embodiment, only the base film 21 including the transparent unit 211 may be used.

The base film 21 may be formed of, for example, polyethyleneterephthalate (PET), triacetyl cellulose (TAC), polyimide (PI), polycarbonate (PC), temperature polyurethane (TPU), and silicon rubber.

The coating layer 22 may be coated on the base film 21. The coating layer 22 may include parts having different hardnesses, and details thereof will be described below.

The coating layer 22 may be formed by coating and hardening a predetermined coating solution on the base film 21. The coating layer 22 according to an exemplary embodiment may have hardness over, e.g., greater than, a certain level, and may be hardened by, for example, UV irradiation and heat treatment.

The display device 100 according to an exemplary embodiment may be made of a bendable material. For example, the display device may be bent along a line A-A, and the cover window 20 may also be bent along the line A-A.

Hereinafter, referring to FIG. 2 and FIG. 3, the cover window 20 of the display device 100 according to an exemplary embodiment will be described in detail.

Figure 2:
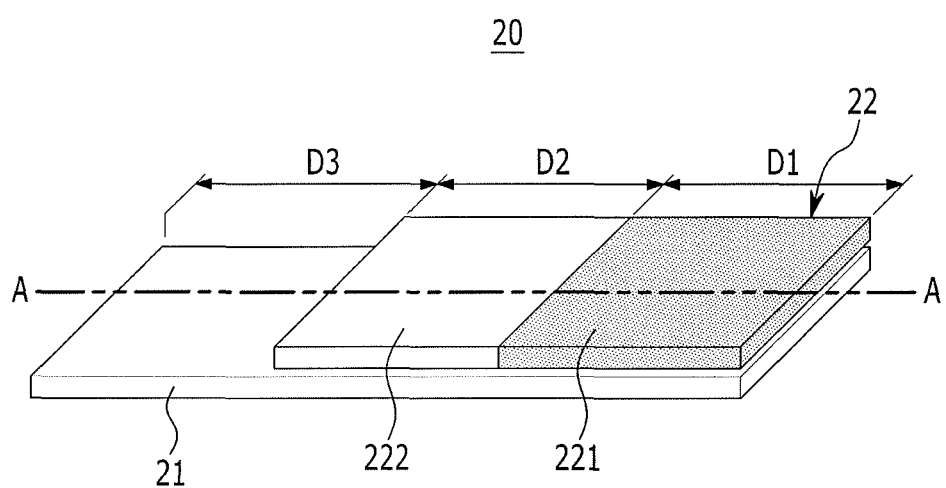
FIG. 2 illustrates a perspective view of a cover window of a display device according to an exemplary embodiment.
Figure 3:
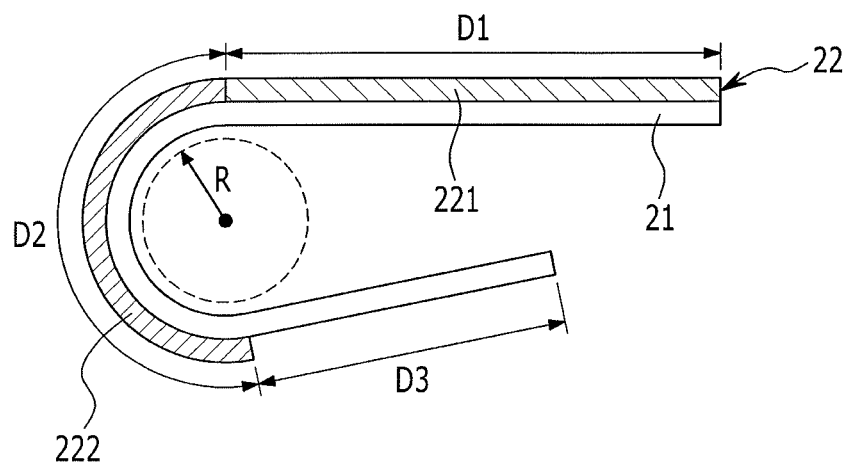
FIG. 3 illustrates a cross-sectional view of a cover window of a display device slid according to an exemplary embodiment.

FIG. 2A illustrates a perspective view of a cover window of a display device according to an exemplary embodiment, and FIG. 3 illustrates a cross-sectional view a cover window of a display device slid according to an exemplary embodiment.

As illustrated in FIG. 2, the cover window 20 may include the base film 21 and the coating layer 22 formed on the base film 21.

The coating layer 22 may include a first region D1 and a second region D2, and the first region D1 and the second region D2 may have different hardnesses from each other. In a third region D3, the coating layer 22 having the same hardness as the second region D2 may be formed or the coating layer 22 may not be formed, and the base film 21 may be exposed.

The display device 100 according to an exemplary embodiment may be a slidable display device. The first region D1 and the second region D2 may correspond to a display area, and the third region D3 may correspond to a non-display area. Hereinafter, for convenience, there will be described an example where the coating layer 22 is not formed in the third region D3.

The second region D2 may be positioned between the first region D1 and the third region D3, and the second region D2 may be bendable. The second region D2 may be more pliable than the first region D1, and the first region D1 may be more rigid than the second region D2. The display device 100 may be slid into the second region D2, as illustrated in FIG. 3, the cover window 20 may be bendable, and the display device 100 may be slid.

The first region D1 may be rigid, and may help protect the display panel 10.

The first region D1 of the coating layer 22 may be formed of a rigid member 221, and the second region D2 may be formed of a soft member 222. The entire first region D1 may be formed of the rigid member 221, and the entire second region D2 may be formed of the soft member 222.

The rigid member 221 may be made of a material having a relatively high hardness as compared with the soft member 222, and the rigid member 221 may also have bendability. The soft member 222 may be more pliable than the rigid member 221.

The cover window 20 of the display device according to an exemplary embodiment may be slidable and may also have a surface hardness over, e.g., greater than, a certain level since the coating layer 22 may include parts having different hardnesses on the base film 21. The first region D1 of the coating layer 22 may help protect the display panel 10, rather than bending the display panel 10, and the second region D2 may help bending the display panel 10, rather than protecting the display panel 10.

The display panel 10 may be slid, and it may be rolled into the second region D2 in a direction toward the third region D3 or may be rolled out of the second region D2 in a direction toward the first region D1.

The coating layer 22 according to an exemplary embodiment may be formed by coating and hardening a coating solution, and the coating solution may include a monomer, an initiator, and a solvent.

The monomer according to an exemplary embodiment may be a hybrimer, which is an organic-inorganic hybrid material, and for example, may include a compound expressed by the following chemical formula 1.

[Chemical Formula 1]

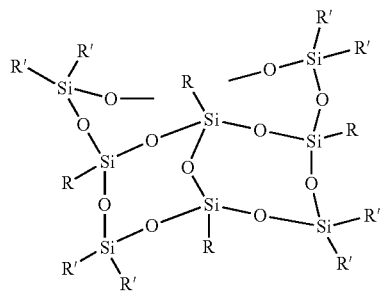

In chemical formula 1, R represents $CH_3$, and R' represents an epoxy group. R' as an epoxy group may be ring-opened in a hardening process, and cross-linking may be carried out by the ring-opened epoxy group.

An amount of the monomer expressed by chemical formula 1 with respect to the total amount of the coating solution may be about 40 wt % to about 90 wt %, for example, about 60 wt %.

The coating solution according to an exemplary embodiment may include an initiator, and for example, may include one or more of an iodine-based initiator or a borate initiator.

The iodine-based initiator may be photohardenable, and the borate initiator may be photohardenable and thermosetting. The initiators may be activated by light or heat during a process for forming a coating layer, and the monomer may be polymerized by the activated initiator.

An amount of the initiator may be 0.1 to 2 wt %, based on a total amount of the coating layer. In the second region D2 formed of the soft member, an amount of the initiator may be 0.1 to 1 wt %, based on a total amount of the coating layer, and in the first region D1 formed of the rigid member, an amount of the initiator may be 1 to 2 wt %, based on a total amount of the coating layer.

If the initiator is included in an amount of 0.1 to 1 wt %, based on a total amount of the coating layer, a degree of cross-linking of the monomer may be relatively low as compared with the initiator being included in an amount of 1 to 2 wt %, based on a total amount of the coating layer, and the coating layer may be formed of a soft member. If the initiator is included in an amount of 1 to 2 wt %, based on a total amount of the coating layer, a degree of cross-linking may be relatively high as compared with the initiator being included in an amount of 0.1 to 1 wt %, based on a total amount of the coating layer.

Due to, for example, a difference in amount of the initiator in the coating solution, it may be possible to form the coating layer 22 including parts having different hardnesses.

In FIG. 2 and FIG. 3, a boundary between the first region D1 and the second region D2 is clearly illustrated for convenience. A boundary between the first region D1 and the second region D2 may not be clearly distinguished, and near the boundary, an amount of the initiator may gradually decrease from the first region D1 toward the second region D2, and a refractive index may be gradually changed and image distortion may be reduced.

A thickness of the coating layer 22 may vary depending on a curvature radius (R in FIG. 3) where the display device 100 may be slid. The coating layer 22 may have a same thickness as the base film 21 under the coating layer 22.

Hereinafter, referring to FIG. 4 and FIG. 5, a method for manufacturing the cover window 20 of the display device according to an exemplary embodiment will be described in detail.

Figure 4:
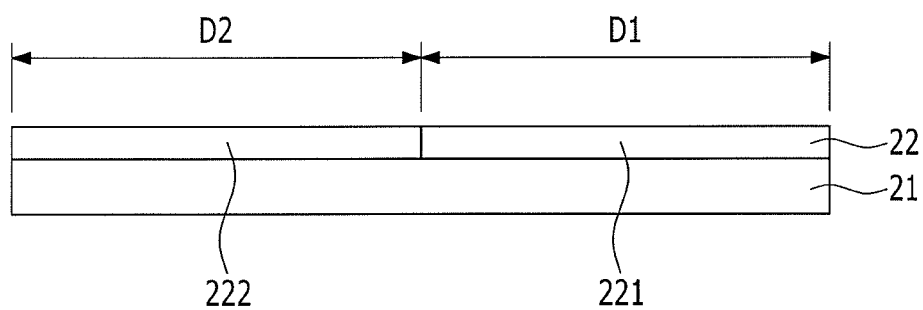
FIG. 4 and FIG. 5 illustrate drawings of a manufacturing process of a cover window of a display device according to an exemplary embodiment.
Figure 5:
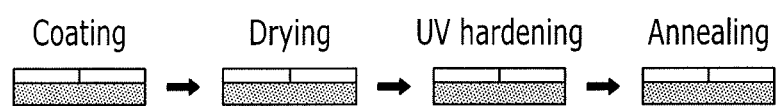

FIG. 4 and FIG. 5 illustrate drawings of a manufacturing process of a cover window of a display device according to an exemplary embodiment.

As illustrated in FIG. 4, the base film 21 may be formed using, for example, polyethyleneterephthalate (PET), triacetyl cellulose (TAC), polyimide (PI), polycarbonate (PC), temperature polyurethane (TPU), and silicon rubber.

Then, a coating solution for forming the coating layer 22 may be coated on the base film 21. In the first region D1, a coating solution including a monomer and an initiator in an amount of 1 to 2 wt %, based on a total amount of the coating layer, may be coated to form a rigid member, and in the second region D2, a coating solution including a monomer and an initiator in an amount of 0.1 to 1 wt %, based on a total amount of the coating layer, may be coated to form a soft member.

Then, the coating solution coated on the base film 21 may be dried, for example, by heat, and hardened by UV irradiation.

Thereafter, by performing an annealing process to the hardened coating solution, the coating layer 22 may be formed. A special high humidity condition may not be needed, and the annealing process may be performed at the normal humidity condition. It may be possible to perform the manufacturing process using the same single unit equipment as that of the above-described process for coating and drying the coating solution.

Hereinafter, referring to FIG. 6, a display device according to another exemplary embodiment will be described.

Figure 6:
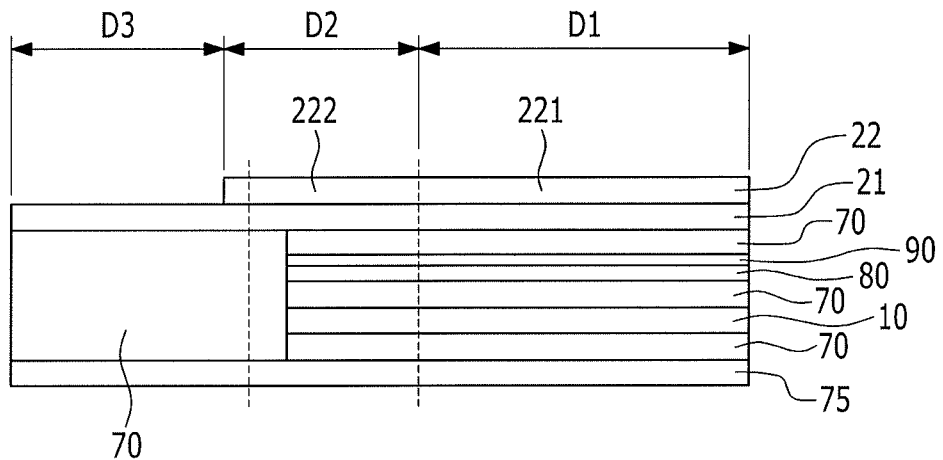
FIG. 6 illustrates a cross-sectional view of a display device according to another exemplary embodiment.

FIG. 6 illustrates a cross-sectional view of a display device according to another exemplary embodiment.

Another exemplary embodiment illustrated in FIG. 6 may be substantially the same as the exemplary embodiment illustrated in FIG. 2 and FIG. 3 except a panel passivation layer 75 bonded to a lower side of the panel 10 via an adhesive layer 70, and a polarization film 80 and a touch panel 90 bonded to an upper side of the panel 10 via an adhesive layer 70, and redundant descriptions will be omitted.

As illustrated in FIG. 6, a display device 100 according to another exemplary embodiment further may include the panel passivation layer 75 bonded to the lower side of the panel 10 via the adhesive layer 70 and the polarization film 80 and the touch panel 90 bonded to the upper side of the panel 10 via the adhesive layer 70.

A cover window 20 may be bonded to an upper side of the touch panel 90 via an adhesive layer 70.

The cover window 20 may be the same as described above, and the panel passivation layer 75 and a base film 21 may be bonded to a lower side of the third region D3 of the cover window via an adhesive layer 20.

A second region D2 may be positioned between a first region D1 and a third region D3, the display panel 10 may be slid, and it may be rolled into the bendable second region D2 in a direction toward the third region D3 or may be rolled out of the bendable second region D2 in a direction toward the first region D1.

Figure 7:
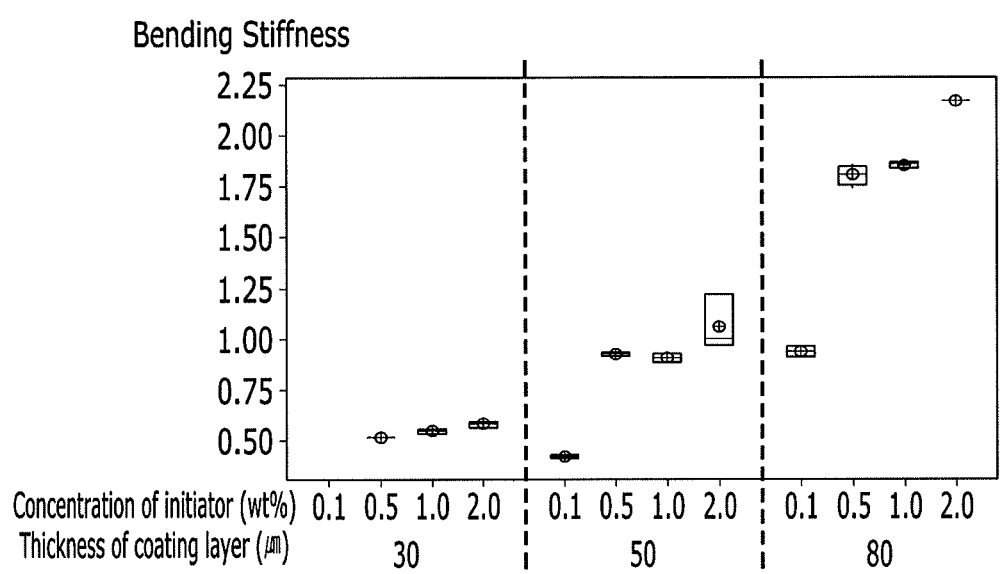
FIG. 7 illustrates a graph of a result of an experiment on bending stiffness depending on an amount of an initiator in manufacturing a cover window of a display device according to an exemplary embodiment.

Referring to FIG. 7, a result of an experiment on bending stiffness of a cover window of a display device according to an exemplary embodiment will be described.

FIG. 7 illustrates a graph of a result of an experiment on bending stiffness depending on an amount of an initiator in manufacturing a cover window of a display device according to an exemplary embodiment.

Referring to FIG. 7, a vertical axis represents bending stiffness referring to a force required to be bent to a specific depth, and a horizontal axis represents a concentration of an initiator and a thickness of a coating layer.

The following Examples are provided in order to highlight characteristics of one or more embodiments, but it will be understood that the Examples are not to be construed as limiting the scope of the embodiments. Further, it will be understood that the embodiments are not limited to the particular details described in the Examples.

In the Examples illustrated in FIG. 7, experiments were conducted with a force required to press a cover window of a display device according to an exemplary embodiment to 2 mm at concentrations of the initiator of 0.1, 0.5, 1.0, and 2.0 wt %, based on a total amount of the coating layer, respectively.

As illustrated in FIG. 7, if an amount of the initiator is small in the whole thickness region of all coating layers, bending stiffness may be weak. As an amount of the initiator is increased, bending stiffness may become stronger.

By way of summation and review, in a display device that may be used for a mobile device, a cover window which may be transparent for a user to see a display unit may be provided in front of a display panel. A cover window may be provided at the outermost part of the device, and it may be resistant to external impact to help protect, for example, a display panel included in the device.

Instead of a comparative structure that may use a switch or a keyboard as an input device, a structure may use a touch panel integrated with a display screen, and a surface of a cover window may frequently be in touch with, for example, a finger, and a mobile device may need to have an increased strength.

A cover window applied to a flexible display device may be configured as a foldable and slidable member having flexibility.

There may exist a trade-off between strength and flexibility of a cover window, and it may be difficult to achieve both strength and flexibility of a cover window.

Provided is a cover window for a display device which may be slidable and also may have a hardness over a certain level. A sliding portion in a sliding region may be formed of a soft member and a fixed portion in a non-sliding region may be formed of a rigid member. Also provided is a display device including the same, and a method for manufacturing the cover window for a display device.

As described above, a coating layer may be divided into a sliding portion and a fixed portion and may be formed of parts having different hardnesses on a base film, and a cover window that may be slidable and also may have a surface hardness over a certain level may be realized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cover window for a display device, the cover window comprising:
   a base film having a first region, a second region, and a third region, the second region being between the first region and the third region; and
   a coating layer on the base film, the coating layer in the second region having a hardness that is less than that of the first region, and the coating layer being absent in the third region.

2. The cover window as claimed in claim 1, wherein the first region is less pliable than the second region.

3. The cover window as claimed in claim 2, wherein the coating layer is a reaction product of a coating solution that includes:
   an initiator; and
   a compound expressed by the following chemical formula 1

[Chemical Formula 1]

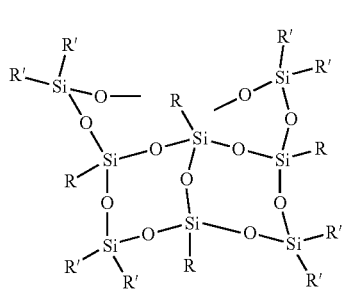

wherein in chemical formula 1, R represents $CH_3$, and R' represents an epoxy group.

4. The cover window as claimed in claim 3, wherein the initiator includes one or more of an iodine-based initiator or a borate initiator.

5. The cover window as claimed in claim 4, wherein:
   the coating solution to form the coating layer in the first region includes the initiator in an amount of 1 to 2 wt %, based on a total amount of the coating layer, and
   the coating solution to form the coating layer in the second region includes the initiator in an amount of 0.1 to 1 wt %, based on a total amount of the coating layer.

6. The cover window as claimed in claim 5, wherein, near a boundary between the first region and the second region, an amount of the initiator in the coating solution to form the coating layer gradually decreases from the first region toward the second region.

7. The cover window as claimed in claim 5, wherein the coating layer has a same thickness as the base film.

8. A display device, comprising:
   a display panel;
   a cover window on the display panel, the cover window including a base film, the base film having a first region, a second region, and a third region, the second region being between the first region and the third region; and
   a coating layer on the base film, the coating layer in the second region having a hardness that is less than that of the first region, and the coating layer being absent in the third region.

9. The display device as claimed in claim 8, wherein the first region is less pliable than the second region.

10. The display device as claimed in claim 9, wherein:
    the coating layer is a reaction product of a coating solution that includes:
    an initiator; and
    a compound expressed by the following chemical formula 1,

[Chemical Formula 1]

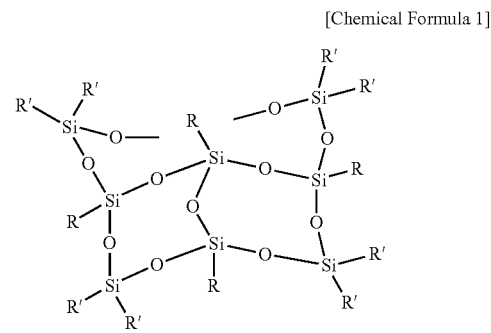

wherein in chemical formula 1, R represents $CH_3$, and R' represents an epoxy group.

11. The display device as claimed in claim 10, wherein the initiator includes one or more of an iodine-based initiator or a borate initiator.

12. The display device as claimed in claim 11, wherein:
    the coating solution to form the coating layer in the first region includes the initiator in an amount of 1 to 2 wt %, based on a total amount of the coating layer, and
    the coating solution to form the coating layer in the second region includes the initiator in an amount of 0.1 to 1 wt %, based on a total amount of the coating layer.

13. The display device of claim 12, wherein, near a boundary between the first region and the second region, an amount of the initiator in the coating solution to form the coating layer gradually decreases from the first region toward the second region.

14. The display device as claimed in claim 12, wherein the coating layer has a same thickness as the base film.

15. The display device as claimed in claim 8, further comprising a touch panel between the display panel and the cover window.

16. The display device as claimed in claim 15, further comprising a passivation layer under the display panel.

* * * * *